United States Patent [19]

Kawabe et al.

[11] Patent Number: 5,554,481
[45] Date of Patent: Sep. 10, 1996

[54] POSITIVE WORKING PHOTORESIST COMPOSITION

[75] Inventors: Yasumasa Kawabe; Kenichiro Satoh; Toshiaki Aoai, all of Shizuoka, Japan

[73] Assignee: Fuji Photo Film Co., Ltd., Kanagawa, Japan

[21] Appl. No.: 361,697

[22] Filed: Dec. 22, 1994

Related U.S. Application Data

[63] Continuation-in-part of Ser. No. 306,329, Sep. 15, 1994, abandoned.

[30] Foreign Application Priority Data

| Sep. 20, 1993 | [JP] | Japan | 5-233537 |
| Sep. 20, 1993 | [JP] | Japan | 5-233538 |
| Oct. 7, 1993 | [JP] | Japan | 5-251780 |
| Oct. 7, 1993 | [JP] | Japan | 5-251781 |

[51] Int. Cl.⁶ ..................................... G03F 7/023
[52] U.S. Cl. .......................... 430/192; 430/165; 430/191; 430/193; 534/557
[58] Field of Search ..................... 430/192, 193, 430/165, 191; 534/557

[56] References Cited

U.S. PATENT DOCUMENTS

| 2,995,442 | 8/1961 | Schmidt et al. | 430/192 |
| 4,407,926 | 10/1983 | Stahlhofen | 430/193 |
| 5,173,389 | 12/1992 | Uenishi et al. | 430/193 |
| 5,200,293 | 4/1993 | Schulz et al. | 430/193 |
| 5,407,779 | 4/1995 | Uetani et al. | 430/192 |

OTHER PUBLICATIONS

JP 6167805 (Derwent Abstract).

JP 2296248 (Derwent Abstract).

*Primary Examiner*—John S. Y. Chu
*Attorney, Agent, or Firm*—Sughrue, Mion, Zinn, Macpeak & Seas

[57] ABSTRACT

A positive working photoresist composition sensitive to radiation, having high resolving power, high sensitivity, and excellent storage stability, and further forming a pattern capable of accurately reproducing a mask size in a wide range of photomask line width. The present invention has been obtained by a composition containing at least one of a 1,2-napthoquinonediazido-5-sulfonic acid ester of a polyhydroxy compound and a 1,2-napthoquinonediazido-4-sulfonic acid ester of a polyhydroxy compound in combination with at least one alkali-soluble resin.

10 Claims, No Drawings

POSITIVE WORKING PHOTORESIST COMPOSITION

This is a Continuation-in-Part of application Ser. No. 08/306,329 filed Sep. 15, 1994, now abandoned.

FIELD OF THE INVENTION

The present invention relates to a positive working photoresist composition sensitive to radiation, and more particularly to a photoresist composition having high resolving power and high sensitivity, and further forming a fine work having a good pattern in cross section.

The positive working photoresist of the present invention is coated on a substrate, such as a semiconductor wafer, a glass plate, a seramic sheet, a metal plate, etc., at a thickness of from 0.5 to 3 μm by a spin coating method or a roller coating method. After drying the coated layer by heating, a circuit pattern, etc., is printed on the layer by irradiation with ultraviolet rays, etc., through a light exposure mask, followed by developing to form a positive image.

Furthermore, by etching the photoresist layer using the positive image as a mask, a pattern can be applied onto the substrate. In the typical application of the positive working photoresist, there is a semiconductor production step, such as IC; a production step for circuit substrate of a liquid crystal and a thermal head; and a photofabrication step.

BACKGROUND OF THE INVENTION

In a positive working photoresist composition, a composition containing an alkali-soluble resin and a naphthoquinonediazide compound, as a photosensitive material, are generally used. For example, "novolac type phenol resin/naphthoquinonediazido-substututed compound" is described in U.S. Pat. Nos. 3,666,473, 4,115,128 and 4,173,370 as the most typical composition. Examples of "a novolac resin composed of cresol-formaldehyde/a trihydroxybenzophenone-1,2-naphthoquinonediazidosulfonic acid ester" are described in L. F. Thompson, *Introduction to Microlithography*, No. 219. pages 112–121, published by ACS.

A novolac resin used as a binder is soluble in an alkaline aqueous solution without being swollen with solution, and is particularly useful in the present invention since the novolac resin gives in particular, highly durable plasma etching, in the case where the images formed are used as a mask for etching. Also, when a naphthoquinonediazide compound is used as a photosensitive material, it functions as a dissolution inhibitor by lowering the alkali solubility of the novolac resin by itself. However, it is unique in that when the naphthoquinonediazide compound is decomposed by irradiation of light, an alkali soluble material is formed which acts to increase the alkali solubility of the novolac resin. Owing to the the large property change due to light, the naphthoquinonediazide compound is particularly useful as a photosensitive material for a positive working photoresist.

Hitherto, many positive working photoresists each containing a novolac resin and a naphthoquinonediazide series photosensitive material have been developed and practically used, and they have given sufficient results in line width, working from about 1.5 μm to 2 μm.

However, recently, with the increase in degree of integration of integrated circuits, in the production of a semiconductor substrate, such as a very large scale integrated circuit, etc., an ultrafine pattern composed of a line width of 1 μm or less has been required. For this use, a photoresist having particularly high resolving power and high sensitivity, from the view points of a high pattern form capable of accurately printing the form of a light-exposure mask, and also a high productivity, has been required. The positive working photoreists using conventional naphtoquinonediazide series photosensitive materials, such as gallic acid esters and 1,2-naphthoquinonediazidosulfonic acid esters of polyhydroxybenzophenones as described in U.S. Pat. Nos. 3,046,118, 3,106,465, and 3,148,983 and JP-B-37-18015, JP-B-56-2333, JP-B-62-28457, (the term "JP-B" as used herein means an "examined published Japanese patent applicatin") cannot meet these requirements.

Also, in the formation of an ultrafine pattern composed of a line width of 0.5 μm or less, it has been found, for example, that, even when a certain coated film thickness can provide a predetermind resolving power, even a small change of a coated film thickness can deteriorate the resolving power which can be obtained (this phenomenon is hereinafter referred to as "film thickness dependence"). Unexpectedly, even when the film thickness changes by as small as several hundredth μm, the resolving power changes largely and furthermore it has been found that any one of the typical positive working photoresists which are now commercially available has more or less such a tendency.

Specifically, when the thickness of a resist film before exposure changes from the predetermined film thickness in the range of $\lambda/4$ n (in which $\lambda$ is an exposure wavelength and n is the refractive index of a resist film at that wavelength) the resolving power which can be obtained changes accordingly.

The presence of the problem of this film thickness dependence is indicated, for example, in SPIE Proceedings, Vol. 1925, p.626 (1993) describing that this problem is caused by the effect of multiple reflections of light within the resist film.

In the industrial processing of the semiconductor substrates, the patterns are formed using the resist films having the thickness which is uneven very slightly because of unevenness of the substrate surface and of irregular coated film thickness. Therefore, the above noted film thickness dependence is one of the difficult problems in carrying out, using the positive working photoresist, fine processing close to a limitation thereof.

Heretofore there have been proposed numerous photosensitive materials, 1,2-naphthoquinone diazide compounds of polyhydroxy compounds having a specific structure, to improve resolving power, as disclosed, for example, in JP-A-57-63526, JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JP-A-3-48250, JP-A-3-158856, JP-A-3-228057, Toku Hyo-4-502519, JP-A-4-365046, U.S. Pat. Nos. 4,957,846, 4,992,356, 5,151,340 and 5,178,986 and European Patent 530148.

However, even when these photosensitive materials were used, sufficient reduction of the film thickness dependence could not be attained.

On the other hand, that the resists providing high contrast and high resolving power can be obtained by using the photosensitive materials having a hydroxyl group in a molecule, is described, for example, in JP-B-37-18015, JP-A-58-150948, JP-A-2-19846, JP-A-2-103543, JP-A-3-228057, JP-A-5-323597, European Patent 573056, U.S. Pat. Nos. 3,184,310, 3,188,210, 3,130,047, 3,130,048, 3,130,049, 3,102,809, 3,061,430 and 3,180,733, West German Patent 938233 and SPIE Proceedings Vol. 631, p.210, Vol. 1672, p.231 (1992), Vol. 1672, p.262 (1992) and Vol. 1925, p.227 (1993).

It is certain that it is possible to attain high contrast by using the resists containing the photosensitive material described in these publications, but sufficient reduction of film thickness dependence cannot be attained.

As described above, it have not been known at all how the resist materials should be designed in order to reduce film thickness dependence and to obtain high resolving power irrespective of the film thickness.

Also, recently, with the increase in degree of integration of semiconductors, the requirements for the particle of the positive working photoresists have increasingly been enhanced. For semiconductors, as the term "1/10 rule" has generally been used, the particles having a size of not less than 1/10 of the smallest line width of a device affect the yields (See, for example, Ultraclean Technology, Vol. 3, No. 1, p.79 (1991)).

To reduce the content of these particles, an ultrafine filter having a pore size of 0.1 μm to 0.05 μm is used in the production of the resists, proving to be useful for reduction of the content of these particles in the production of the resists.

However, even if the content of the particles is low in the production of the resists, the content of the particles in the resists frequently increases with time. The increased amount of the particles with time mostly comes from the 1,2-quinonediazide photosensitive materials. Various attempts have been made to reduce the increase of the particles with time.

For example, the use of photosensitive materials in which part of a hydroxyl group of polyhydroxyl compounds are acylated or sulfonylated (JP-A-62-178562), the use of a mixture of a 1,2-naphthoquinonediazido-4-sulfonic acid ester and a 1,2-naphthoquinonediazido-5-sulfonic acid ester (JP-A-62-284354), the use of thermally modified 1,2-naphthoquinonediazide photosensitive materials (JP-A-63-113451), the reduction of the amount of residual catalysts in photosensitive materials (JP-A-63-236030), the synthesis of photosensitive materials in the presence of anion exchange resins (JP-A-63-236031) and the use of photosensitive materials incorporated with solvent easily soluble therein (JP-A-61-260239, JP-A-1-293340) have been attempted.

However, the positive working photoresist compositions using these photosensitive materials have not yet been sufficiently improved for practical use and, also, when these photoresist compositions are stored as solutions, the photosensitive components are liable to form deposits, which frequently causes a problem in their storage stability.

SUMMARY OF THE INVENTION

A first object of the present invention is to provide a positive working photoresist composition for ultrafine processing which has high resolving power and low film thickness dependence of resolving power. In the present invention the term "film thickness dependence" means the fluctuation of resolving power of the resist which has been exposed and developed (and, if needed, baked), which fluctuation is caused when the thickness of the resist before exposure changes in the range of λ/4 n.

A second object of the present invention is to provide a positive working photoresist composition which has wide development latitude and which is not liable to form developer deposits. The term "development latitude" as used herein can be expressed by development time dependence of or developer temperature dependence of the line width of the resist obtained by development. The term "development deposits" as used herein means a trace of undissolved resist which remains between the fine patterns after development and which can be observed by a scanning electron microscope or the like.

A third object of the present invention is to provide a positive working photoresist composition which does neither form precipitates of a developer nor generates microgels with time, that is, which has such excellent storage stability that no increase of the amount of the particles can be observed.

As the result of various investigations taking into consideration the various characteristics of the positive working photoresist compositions described above, the inventors have discovered that the objects described above can be attained by using an alkali-soluble resin and a quinonediazide compound having a specific structure and have succeeded in accomplishing the present invention based on the discovery.

That is, the objects of the present invention have been attained by a positive working photoresist composition containing a 1,2-naphthoquinonediazido-5-(and/or -4-)sulfonic acid ester of a polyhydroxy compound represented by the following formulas (I), (II) or (III) and an alkali-soluble resin.

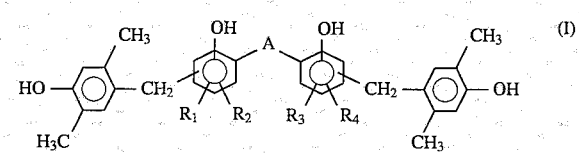

wherein $R_1$ to $R_4$, which may be the same or different, each represents a hydrogen atom or an alkyl group having 1–8 carbon atoms; and A represents —S— or —SO$_2$—.

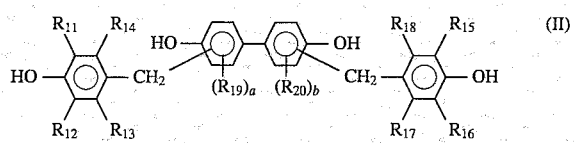

wherein $R_{11}$ to $R_{20}$, which may be the same or different, each represents a hydrogen atom, a halogen atom, an alkyl group, an aryl group, an alkoxy group, an acyl group, an alkenyl group, an aralkyl group, an alkoxycarbonyl group, an arylcarbonyl group, an acyloxy group, a nitro group, or a cyano group, provided that, when one or both of $R_{11}$ and $R_{12}$ are groups other than a hydrogen atom, at least one of $R_{13}$ and $R_{14}$ is a group other than a hydrogen atom and when one or both of $R_{15}$ and $R_{16}$ are groups other than a hydrogen atom, at least one of $R_{17}$ and $R_{18}$ is a group other than a hydrogen atom; and a and b each represents 1 or 2.

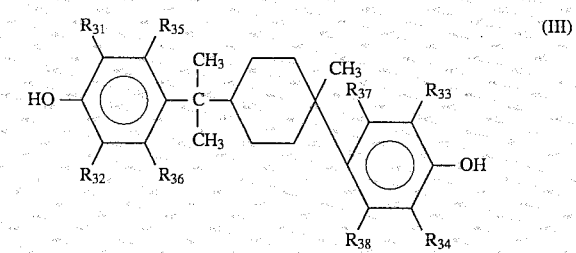

wherein $R_{31}$ to $R_{34}$, which may be the same or different, each represents a hydrogen atom, a hydroxy group, a halogen atom, an alkyl group, an aryl group, an alkoxy group, an acyl group, an alkenyl group, an aralkyl group, an alkoxycarbonyl group, an arylcarbonyl group, an acyloxy group, a nitro group, a cyano group, or a group represented by the following formula:

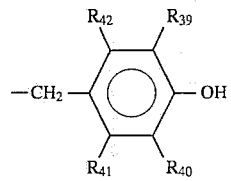

wherein $R_{39}$ to $R_{42}$, which may be the same or different, each represents a hydrogen atom, an alkyl group, or an alkoxy group and $R_{35}$ to $R_{38}$, which may be the same or different, each represents a hydrogen atom, a hydroxy group, a halogen atom, an alkyl group, an aryl group, an alkoxy group, an acyl group, an alkenyl group, an aralkyl group, an alkoxycarbonyl group, an arylcarbonyl group, an acyloxy group, a nitro group, or a cyano group.

DETAILED DESCRIPTION OF THE INVENTION

The present invention is now described in detail.

In $R_1$ to $R_4$ of formula (I) described above, the alkyl group having 1–8 carbon atoms includes methyl, ethyl, propyl, isopropyl, n-butyl, isobutyl, sec-butyl, t-butyl, n-octyl, hydroxyethyl and cyclohexyl, and the alkyl groups having from 1 to 3 carbon atoms, such as methyl, ethyl, propyl, isopropyl and hydroxyethyl, are preferred.

Specific examples of the compounds represented by formula (I) are illustrated by the following compounds I-1 to I-5, although the compounds represented by formula (I) in the present invention are not limited to these compounds.

These polyhydroxy compounds can be used singly or in combination.

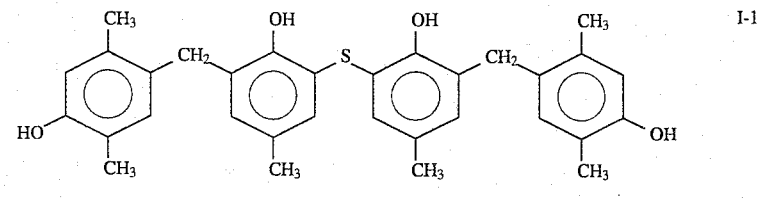

I-1

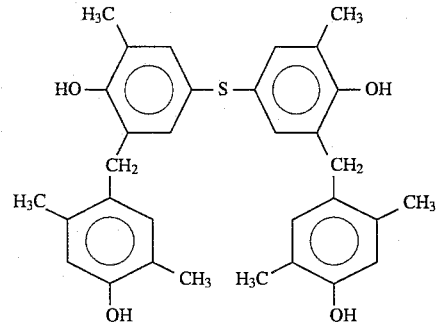

I-2

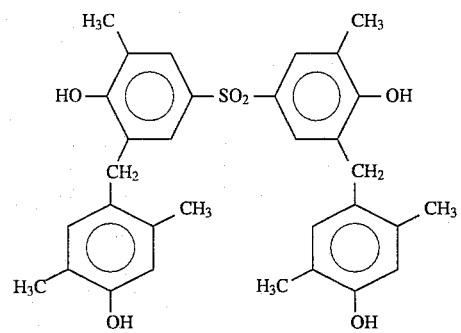

I-3

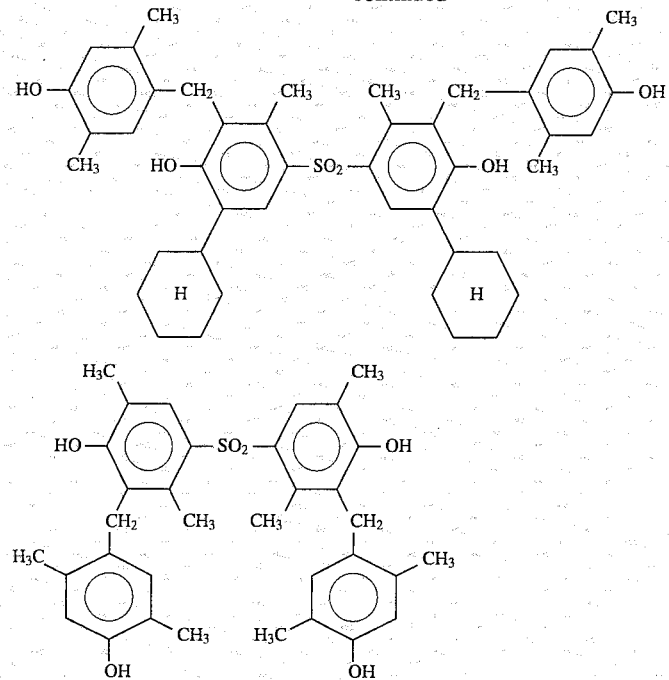

Of the polyhydroxy compounds of formula (II), preferred compounds are those of formula (II) in which the hydroxybenzyl groups are bonded to the benzene rings at the ortho position relative to the hydroxyl group as shown below.

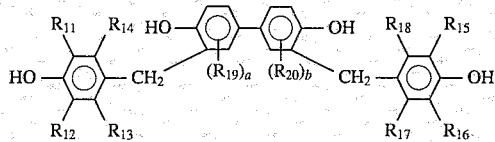

In $R_{11}$ to $R_{20}$ of formula (II) described above, as the halogen atom, chlorine, bromine, and iodine are preferred; as the alkyl group, the alkyl groups having from 1 to 4 carbon atoms, such as methyl, ethyl, propyl, n-butyl, isobutyl, sec-butyl, and t-butyl is preferred; and as the alkoxy group, the alkoxy group having from 1 to 4 carbon atoms, such as methoxy, ethoxy, hydroxyethoxy, propoxy, hydroxypropoxy, isopropoxy, n-butoxy, iso-butoxy, sec-butoxy, and t-butoxy is preferred. Also, as the alkenyl group, the alkenyl group having from 2 to 4 carbon atoms, such as vinyl, propenyl, allyl, and butenyl is preferred.

As the aryl group, phenyl, xylyl, toluyl, and cumenyl are preferred; as aralkyl group, benzyl, phenetyl, and cumyl are preferred; as the alkoxycarbonyl group, methoxycarbonyl and ethoxycarbonyl are preferred; as the arylcarbonyl group, benzoyloxy is preferred; as the acyloxy group, butyryloxy and acetoxy are preferred; and as the acyl group, formyl, acetyl, butyryl, benzoyl, cyanamoyl, and valeryl are preferred.

Specific examples of the compounds represented by formula (II) are illustrated by the following Compounds II-1 to II-5 but the compounds of formula (II) used in the present invention are not limited to these compounds.

These polyhydroxy compounds can be used singly or in combination.

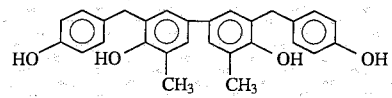

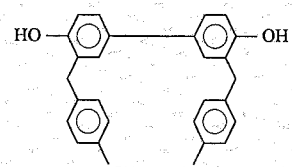

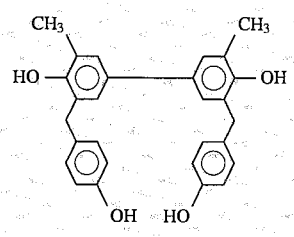

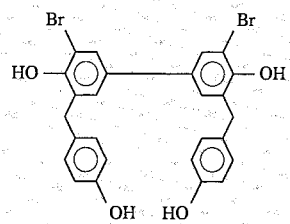

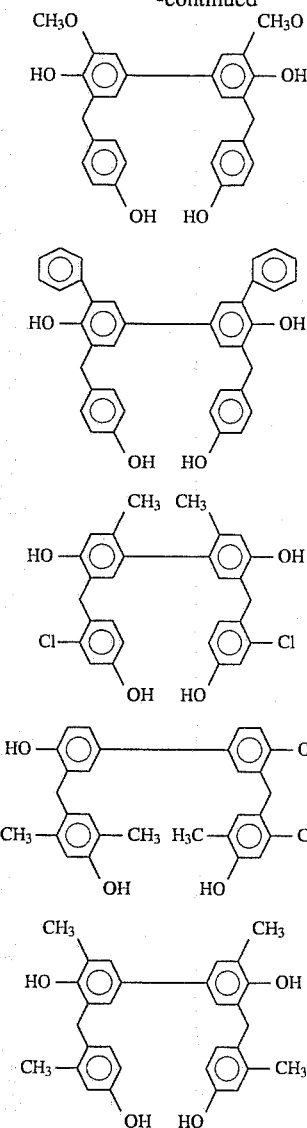

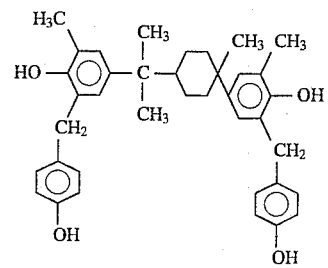

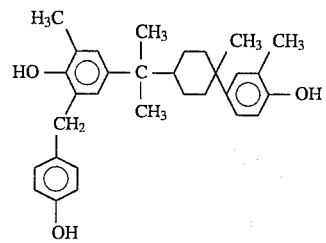

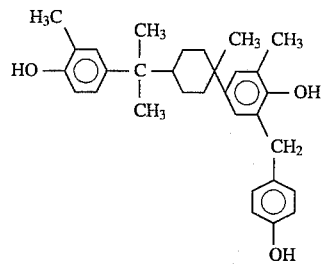

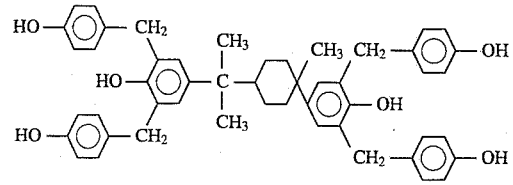

In $R_{31}$ to $R_{32}$ of formula (III) described above, as the halogen atom, chlorine, bromine, and iodine are preferred; as the alkyl group, the alkyl group haivng from 1 to 4 carbon atoms, such as methyl, ethyl, propyl, n-butyl, isobutyl, sec-butyl and t-butyl is preferred; and the alkoxy group, the alkoxy groups having from 1 to 4 carbon atoms, such as methoxy, ethoxy, hydroxyethoxy, propoxy, hydroxypropoxy, isopropoxy, n-butoxy, isobutoxy, sec-butoxy, and t-butoxy is preferred. Also, as the alkenyl group, the alkenyl group having from 2 to 4 carbon atoms, such as vinyl, propenyl, allyl, and butenyl is preferred.

As the aryl group, phenyl, xylyl, toluyl, and cumenyl are preferred; as the aralkyl group, benzyl, phenetyl, and cumyl are preferred; as the alkoxycarobnyl group, methoxycarbonyl and ethoxycarbonyl are preferred; as the arylcarboxy group, benzoyloxy is preferred; as the acyloxy group, butyryloxy and acetoxy are preferred; and as the acyl group, formyl, acetyl, butyryl, benzoyl, cyanamoyl, and valeryl are preferred.

Specific examples of the compound represented by formula (III) are illustrated by the following compounds III-1 to III-4 but the compounds represented by formula (III) used in the present invention are not limited to these compounds.

These polyhydroxy compounds can be used singly or in combination.

The compound of the present invention is obtained by carrying out an ordinary esterification reaction of part or all of the hydroxy groups of the polyhydroxy compound described above with 1,2-naphthoquinonediazido-5-(and/or -4-)sulfonyl chloride in the presence of a basic catalyst.

That is, the polyhydroxy compound is placed in a flask together with 1,2-naphthoquinonediazido-5-(and/or -4-)sulfonyl chloride, and a solvent, such as dioxane, acetone, methyl ethyl ketone, and N-methylpyrrolidone, and a basic catalyst such as sodium hydroxide, sodium carbonate, sodium hydrogencarbonate, and triethylamine, is added dropwise to the mixture to perform the condensation reaction. The product obtained is washed with water, purified, and dried.

In an ordinary esterification reaction, a mixture of products each having a different esterification number and a different esterified position is obtained, but by selection of the synthesis condition or the structure of the polyhydroxy compound being used, a specific isomer can be also selectively esterified. The esterification ratio in the present invention is defined as the average value of the mixture.

The esterification ratio thus defined can be controlled by the mixing ratio of the raw materials, i.e., the polyhydroxy compound and 1,2-naphthoquinonediazido-5-(and/or -4-)sulfonyl chloride. That is, since substantially all the 1,2-naphthoquinonediazido-5-(and/or -4-)sulfonyl chloride added causes the esterification reaction, to obtain a desired esterification ratio, the mol ratio of the raw materials may be controlled.

If desired, the 1,2-naphthoquinonediazido-5-sulfonic acid ester and the 1,2-naphthoquinonediazido-4-sulfonic acid ester can be used together.

Also, the reaction temperature in the foregoing method is usually from −20° C. to 60° C., and preferably from 0° C. to 40° C.

The photosensitive compound(s) in the present invention synthesized by the method as described above is or are compounded with an alkali-soluble resin singly or as a mixture of two or more kinds thereof and the compounding amount of the compound(s) is from 5 to 100 parts by weight, and preferably from 10 to 50 parts by weight to 100 parts by weight of the novolac resin (the alkali-soluble resin). If the compounding amount of the compound is less than 5 parts by weight, the residual film ratio is greatly lowered, while if the compounding amount is over 100 parts by weight, the sensitivity and the solubility in a solvent are lowered.

The alkali-soluble resin being used in the present invention, there includes novolac resin, acetone-pyrogallol resin, and polyhydroxystyrene and derivatives thereof.

In these resins, a novolac resin is particularly preferred and is obtained by addition-condensing a selected first monomer as the main component with an aldehyde in the presence of an acidic catalyst.

The selected first monomer includes phenol; cresols, such as m-cresol, p-cresol, and o-cresol; xylenols, such as 2,5-xylenol, 3,5-xylenol, 3,4-xylenol, and 2,3-xylenol; alkylphenols such as m-ethylphenol, p-ethylphenol, o-ethylphenol, ethylphenol, and p-t-butylphenol; trialkylphenols, such as 2,3,5-trimethylphenol, and 2,3,4-trimethylphenol; alkoxyphenols, such as p-methoxyphenol, m-methoxyphenol, 3,5-dimethoxyphenol, 2-methoxy-4-methylphenol, m-ethoxyphenol, p-ethoxyphenol, m-propoxypheol, p-propoxyphenol, m-butoxyphenol, and p-butoxyphenol; bisalkylphenols, such as 2-methyl-4-isopropylphenol; and hydroxyaromatic compounds, such as m-chlorophenol, p-chlorophenol, o-chlorophenol, dihydroxybiphenyl, bisphenol A, phenylphenol, resorcinol, and naphthol, can be used singly or as a mixture thereof although the alkali-soluble resins used in this invention are not limited to these resins.

As the aldehyde being used for the addition condensation reaction described above, there are, for example, formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and the acetal compounds thereof (e.g., chloroacetaldehyde diethyl acetal), can be used and in these compounds, formaldehyde is preferably used.

These aldehydes can be used singly or in combination.

Also, as the acidic catalyst, hydrochloric acid, sulfuric acid, formic acid, acetic acid, or oxalic acid can be used.

Also, the techniques, such as those disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2,282745, JP-A-4-101147, and JP-A-4-122938, that is, novolac resins from which low-molecular components are removed or reduced may be used in the present invention.

The weight average molecular weight of novolac resin thus obtained is preferably in the range of from 2,000 to 30,000. If the average molecular weight is less than 2,000, reduction of the layer at the unexposed portion after development is large, and if the average molecular weight is over 30,000, the developing speed is lowered. The particularly preferred range of weight average molecular weight of novolac resin is from 6,000 to 20,000.

In this case, the weight average molecular weight is defined as the polystyrene converted value of gel permeation chromatography.

In the present invention, the foregoing photosensitive compound is mainly used, but if necessary, the esterification product of the polyhydroxy compound shown below with 1,2-naphthoquinonediazido-5-(and/or -4-)sulfonyl chloride can be used together.

Examples of the polyhydroxy compound include the following: polyhydroxybenzophenones, such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,3',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone; polyhydroxyphenyl alkyl ketones, such as 2,3,4-trihydroxyacetophenone, 2,3,4-trihydroxyphenyl pentyl ketone and 2,3,4-trihydroxyphenyl hexyl ketone; bis((poly)hydroxyphenyl)alkanes, such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguaiaretic acid; polyhydroxybenzoic acid esters, such as propyl 3,4,5-trihydroxybenzoate, phenyl 2,3,4-trihydroxybenzoate, and phenyl 3,4,5-trihydroxybenzoate; bis(polyhydroxybenzoyl)alkanes or bis(polyhydroxybenzoyl)aryls, such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene; alkylene di(polyhydroxybenzoates), such as ethylene glycol di(3,5-dihydroxybenzoate) and ethylene glycol di(3,4,5-trihydroxybenzoate); polyhydroxybiphenyls, such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol; bis(polyhydroxy)sulfides, such as 4,4'-thiobis(1,3-dihydroxy)benzene; bis(polyhydroxyphenyl)ethers, such as 2,2',4,4'-tetrahydroxy diphenyl ether; bis(polyhydroxyphenyl)sulfoxides, such as 2,2',4,4'-tetrahydroxydiphenyl sulfoxide; bis(polyhydroxyphenyl)sulfones such as 2,2',4,4'-diphenylsulfone; polyhydroxytriphenylmethanes, such as tris(4-hydroxyphenyl)methane, 4,4',4''-trihydroxy-3,5,3',5'-tetramethyltriphenylmethane, 4,4',3'',4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3'',4''-octahydroxy-5,5'-diacetyltriphenylmethane and 2,4,6,2',4',6'-hexahydroxy-5,5'-dipropionyltriphenylmethane; polyhydroxyspirobiindanes, such as 3,3,3',3'-tetramethyl-1,1'-spirobiindane-5,6,5',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol, and 3,3,3',3'-tetramethyl-1,1'-spirobiindane-4,5,6,5',6',7'-hexol; polyhydroxyphthalides, such as 3,3-bis(3,4-dihydroxyphenyl)phthalide, 3,3-bis(2,3,4-trihydroxyphenyl)phthalide, and 3',4',5',6'-tetrahydroxyspiro[phthalido-3,9'-xanthene]; flavonoid dyes, such as morin, quercetin, and rutin; the polyhydroxy compounds described in JP-A-4-253058, such as α,α',α''-tris(4-hydroxyphenyl)-1,3,5-triisopropylbenzene, α,α',α''-tris(3,5-dimethyl-4-hydroxyphenyl)-1,3,5-triisopropylbenzene, α,α',α''-tris(3,5-diethyl-4-hydroxyphenyl)-1,3,5-triisoporpylbenzene, α,α',α''-tris(3,5-di-n-propyl-4-hydroxyphenyl)-1,3,5-triisopropylbenzene, α,α',α''-tris(3,5-diisopropyl-4-hydroxyphenyl)1,3,5-triisopropylbenzene, α,α',α''-tris(3,5-di-n-butyl-4-hydroxyphenyl)1,3,5-triisoporpylbenzene, α,α',α''-tris(3-methyl-4-hydroxyphenyl)-1,3,5-triisopropylbenzene, α,α',α''-tris(3-methoxy-4-hydroxyphenyl)1,3,5-triisopropylbenzene, α,α',α''-tris(2,4-dihydroxyphenyl)1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4''-hydroxyphenyl)ethyl]benzene, 1-[α-methyl-α-(4'-hydroxyphenyl)ethyl]-3-[α,α'-bis(4''-hydroxyphenyl)ethyl]benzene, 1-[α-methyl-α-(3',5''-dimethyl-4'-hydroxyphenyl)ethyl]-4-[α,α'-bis(3'',5''-dimethyl-4''-hydroxyphenyl)ethyl]benzene, 1-[α-methyl-α-(3'-methyl-4'-hydroxyphenyl)ethyl]-4-[α,α'-bis(3''-methyl-4''-hydroxyphenyl)ethyl]benzene, 1-[α-methyl-α-(3'-methoxy-4'-hydroxyphenyl)ethyl]-4-[α',α'-bis(3''-methoxy-4''-hydroxyphenyl)ethyl]benzene, 1-[α-methyl-α-(2',4'-dihydroxyphenyl)ethyl]-4-]α,α'-bis(4'-hydroxyphenyl)ethyl]benzene, and 1-[α-methyl-α-(2',4'-dihydroxyphenyl)ethyl]-3-[α',α'-bis(4''-hydroxyphenyl)ethyl]benzene; and also p-bis(2,3,4-trihydroxybenzoyl)benzene, p-bis(2,4,6-trihydroxybenzoyl)beneene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoy)benzene, 1,2,3-tris(2,3,4-trihydroxybenzoyl)benzene, 1,2,4-tris(2,3,4-trihydroxybenzoyl)benzene, 1,2,4,5-tetrakis(2,3,4trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5-ethylbenzyl)-p-cresol, 2,6-bis(2',4'-dihydroxybenzyl)-p-cresol, 2,6-bis(2'-hydroxy-3'-t-butyl-5'-methylbenzyl)-p-cresol, 2,6-bis(2',3',4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethylphenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)-1,3,4-trihydroxyphenol, 4,6-bis(2',4',6'-trihydroxybenzyl)-2,4-dimethylphenol, and 4,6-bis(2',3',4'-trihydroxybenzyl)-2,5-dimethylphenol.

Also, oligomers of a phenol resin, such as a novolac resin, can be used in this invention.

The naphthoquinonediazide ester photosensitive materials of these polyhydroxy compounds can be used singly or in combination.

As to the ratio of the photosensitive material and the alkali-soluble resin tube used, the amount of the photosensitive material is from 5 to 100 parts by weight, and preferably from 10 to 50 parts by weight to 100 parts by weight of the alkali-soluble resin. If the amount of the photosensitive material is less than 5 parts by weight, the residual film ratio is greatly lowered, on the other hand, if the amount is over 100 parts by weight, the sensitivity and the solubility in a solvent are lowered.

The photoresist composition of the present invention can further contain a polyhydroxy compound for accelerating the dissolution thereof in a developer. Examples of preferred hydroxy compound used for such purpose include, for example, phenols, resorcin, phloroglucine, 2,3,4-trihydroxybenzophenone, 2,3,4,4'-tetrahydroxybenzophenone, 2,3,4,3',4',5'-hexahydroxybenzophenone, an acetone-pyrogallol condensed resin, phloroglucide, 2,4,2',4'-bi[henyltetrol, 4,4'-thiobis(1.3-dihydroxy)benzene, 2,2',4,4'-tetrahydroxy diphenyl ether, 2,2',4,4'-tetrahydroxydiphenylsulfoxide, 2,2',4,4'-tetrahydroxyphenylsulfone, tris(4-hydroxyphenyl) methane, 1,1-bis(4-hydroxyphenyl)cyclohexane, 4,4'-(α-methylbenzylidene)bisphenol, α,α',α''-tris(4-hydroxyphenyl)-1,3,5-triisopropylbenzene, and α,α',α''-rtis(4-hydroxyphenyl)-1-ethyl-4-isopropylbenzene.

The polyhydroxy compound described above may be used in an amount of usually not more than 100 parts by weight, and preferably from 5 to 50 parts by weight to 100 parts by weight of the quinonediazide compound.

A solvent which can be used for dissolving the photosensitive material of the present invention and the alkali-soluble novolac resin is, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate or butyl acetate.

These organic solvents can be used singly or in combiantion.

Furthermore, the solvent described above can be used together with a high-boiling organic solvent, such as N-methylformamide, N,N-dimethylformamide, N-methylacetamide, N,N-dimethylacetamide, N-methylpyrrolidone, dimethyl sulfoxide, and benzyl ethyl ether.

The positive working photoresist composition of the present invention can contain a surface active agent for further improving the coating property, such as a striation.

Examples of the surface active agent being used in the present invention include nonionic surface active agents, e.g., polyoxyethylene alkyl ethers, such as polyoxyethylene lacuryl ether, polyoxyethylene stearyl ether, polyoxyethylene cetyl ether, and polyoxyethylene oleyl ether; polyoxyethylene alkylallyl ethers, such as polyoxyethylene octylphenol ether, and polyoxyethylene nonylphenol ether; polyoxyethylenepolyoxypropylene block copolymers; sorbitan fatty acid esters, such as sorbitan monolaurate, sorbitan monopalmitate, sorbitan monostearate, sorbitan monoleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine series surface active agents, such as F Top EF301, EF303, and EF352 (trade names, made by Shin Akita Kasei K.K.), Megafax F171, F173 (trade names, Dainippon Ink and Chemicals, Inc.), Fluorad FC430, FC431 (trade names, made by Sumutomo 3M Limited) and Asahiguard AG710, Surflon S-382, SC101, SC102, SC103, SC104, SC105, SC106 (trade names, made by Asahi Glass Co., Ltd.); and also an organosiloxane polymer KP341 (trade name, made by Shin-Etsu Chemical Co., Ltd.), and acrylic acid series or metahcrylic acid series (co)polymer Polyflow No. 75, No. 95 (trade names, made by Kyoeisha Yushi Kagaku Kogyo K.K.).

The compounding amount of the surface active agent is usually not more than 2 parts by weight, and preferably not more than 1 part by weight per 100 parts by weight of the alkali-soluble resin and the quinonediazide compound in the photoresist composition of the present invention.

These surface active agents may be used singly or in combination.

As the developer for the positive working photoresist composition of the present invention, an aqueous solution of an alkali, e.g., inorganic alkalis, such as sodium hydroxide, potassium hydroxide, sodium carbonate, sodium silicate, sodium metasilicate, and aqueous ammonia; primary amines, such as ethylamine, and n-propylamine; secondary amines, such as diethylamine, and di-n-butylamine; tertiary amines, such as triethylamine, and methyldiethylamine; alcoholamines, such as dimethylethanolamine, and triethanolamine; quaternary ammonium salts, such as tetramethylammonium hydroxide, and tetraethylammonium hydroxide; and cyclic amines, such as pyrrole, and piperidine, can be used.

Furthermore, the aqueous solution of the alkali described above can contain proper amounts of an alcohol and a surface active agent.

If necessary, the positive working photoresist composition of the present invention can further contain a dye, a plasticizer, and an adhesive aid.

Specific examples of the dye are Methyl Violet, Crystal Violet, and Malachite Green; specific examples of the plasticizer are stearic acid, an acetal resin, a phenoxy resin, and an alkyd resin, and specific examples of the adhesive aid are hexamethyl disilazane, and chloromethylsilane.

The positive working photoresist composition described above is coated on a substrate (e.g., silicon dioxide-coated silicon) used for the production of a precise integrated circuit element by a proper coating method, such as a spinner, and a coater. The coated layer is prebaked, light-exposed through a definite mask, if necessary, post-heated (PEB: pose exposure bake), developed, rinsed, and dried, whereby a good resist can be obtained.

The following specific examples are provided for the purposes of illustration and are not to be construed as limiting the invention in any way. Unless otherwise inaicated, all parts, percents and ratios in these examples are by weight.

EXAMPLES AND COMPARATIVE EXAMPLES

I. Synthesis examples of the polyhydroxy compounds of the present invention are described below (1) Synthesis of Compound I-3:

In a four neck flask having a stirrer, a reflux condenser, a thermometer and a dropping apparatus were placed 123.2 g of 3,3'-dimethyl-4,4'-dihydroxydiphenyl sulfide and one liter of acetic acid. After the sulfide was dissolved, one liter of 30% aqueous hydrogen peroxide was added dropwise over 15 minutes to the flask. The contents of the flask were heated at 100° C. for one hour. White powders precipitated after the reaction were filtered away to obtain 111.3 g of the following Compound A.

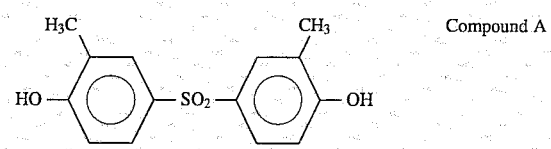

In a similar reaction vessel were placed 111.3 g of Compound A obtained above and 364.6 g of a 25% aqueous solution of tetramethylammonium hydroxide (TMAH). The mixture was heated to 50° C. to dissolve the Compound A and then 72.1 g of paraformaldehyde was added to the mixture over 10 minutes. The contents of the flask were heated at 80° C. for 40 hours. One liter of distilled water and 100 ml of hydrochloric acid were added to the mixture solution after the reaction. The aqueous layer was drawn by decantation into a flask. The resulting aqueous solution was saturated with Nacl and then subjected to extraction with ethyl acetate. The oily layer obtained was purified by column chromatography to obtain 81.2 g of white powders (Compound B shown below).

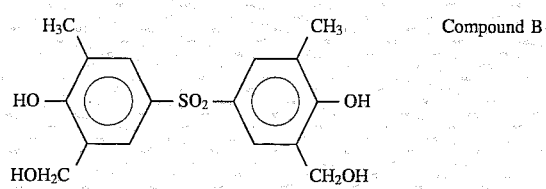

Next, 67.7 g of Compound B obtained above, 146.6 g of 2,5-xylenol and 800 ml of methanol were placed in a three neck flask having a stirrer, a reflux condenser and a thermometer and were heated to 60° C. to dissolve the Compound B and the 2,5-xylenol. After completion of dissolution 2 g of concentric sulfuric acid was added to the flask. The solution in the flask was heated to reflux and stirred for 5 hours. The reaction mixture solution was poured into 10 liters of distilled water to crystallize. The resulting mixture was filtered to obtain yellow solids, which were then purified by column chromatography to obtain 54.7 g of the desired product, Compound I-3 (white powders).

(2) Synthesis of Compound II-1:

In a four neck flask having a stirrer, a reflux condenser, a thermometer and a dropping apparatus were placed 107.1 g of 3,3'-dimethyl-4,4'-dihydroxybiphenyl, 455.8 g of 25% aqueous solution of TMAH and 500 ml of distilled water. The mixture was heated to 40° C. to dissolve the 3,3'-dimethyl-4,4'-dihydroxybiphenyl. To the mixture was added 243.5 g of 37% aqueous formaldehyde over 30 minutes. The mixture was stirred for 12 hours at 40° C. To the reaction solution were added 500 ml of distilled water and 125 ml of hydrochloric acid. Brown solids were obtained. The brown solids were purified by column chromatography to obtain 95.9 g of the following Compound C (white powders).

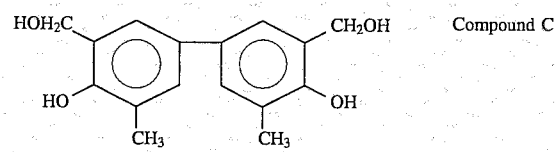

Next, 82.2 g of Compound C obtained above, 282.3 g phenol and 1 liter of methanol were placed in a three neck flask having a stirrer, a reflux condenser and a thermometer and heated to 60° C. to dissolve the Compound C. After completion of dissolution, 3 g of concentric sulfuric acid was added to the flask. The solution in the flask was heated to reflux and stirred for 5 hours. The reaction mixture solution was poured into 10 liters of distilled water to crystallize. The resulting mixture was filtered to obtain brown solids, which were then purified by column chromatography to obtain 63.9 g of the desired product, Compound II-1 (white powders).

(3) Synthesis of Compound II-2:

In a three neck flask having a stirrer, a reflux condenser and a thermometer were placed 93.1 g of 2,2'-biphenol, 140 g of hexamethylenetetramine and 500 ml of trifluoroacetic acid. The mixture was heated to reflux for 12 hours. The resulting mixture solution was subjected to vacuum distillation to remove the trifluoroacetic acid and then poured into ice water to crystallize. The resulting mixture was filtered to obtain yellow powders, which were then purified by column chromatography to obtain 48.4 g of white powders.

Separately, a four neck flask having a stirrer, a reflux condenser, a thermometer and a dropping apparatus was iced and was charged with 20 g of lithium aluminium hydride (LAH) and 500 ml of tetrahydrofuran (THF). To the flask was added dropwise a THF solution containing 48.4 g of the white powders obtained above, over 20 minutes.

After completion of dropwise addition, the mixture in the flask was warmed to room temperature to complete the reaction. An aqueous solution of sodium sulfate was added to the reaction mixture and stirred. Thereafter, to the mixture magnesium sulfate was added. Dehydration, filtration and concentration were carried out to obtain 44.3 g of the following Compound D (white powders).

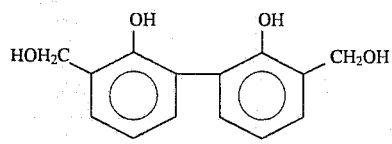

Compound D

Next, 24.6 g of the above-obtained Compound D, 99.1 g of phenol and 500 ml of methanol were placed in a three neck flask having a stirrer, a reflux condenser and a thermometer. The mixture in the flask was heated to 60° C. to dissolve the Compound D. After completion of dissolution, 1 g of concentric sulfuric acid was added to the flask. The mixture was heated to reflux and stirred for 5 hours. The reaction mixture was poured into 5 liters of distilled water to crystallize. The resulting mixture was filtered to obtain yellow solids, which were then purified by column chromatography to obtain 20.4 g of the desired product, Compound II-2 (white powders).

(4) Synthesis of Compound III-1:

In a four neck flask having a stirrer, a reflux condenser, a thermometer and a dropping apparatus were placed 70.5 g of terpenebis-o-cresol (available from Honshu Chemical Industry Co., Ltd.), 182.3 g of a 25% aqueous solution of TMAH and 100 ml of distilled water. The mixture was heated to 40° C. to dissolve terpenebis-o-cresol. To the mixture solution was added dropwise 97.4 g of a 37% aqueous solution of formaldehyde over 30 minutes. The mixture was stirred while heating at 40° C. for 10 hours. To the reaction mixture solution were added 100 ml of distilled water and 50 ml of hydrochloric acid to obtain brown solids. The brown solids obtained were purified by column chromatography to obtain 57.8 g of the following Compound E (white powders).

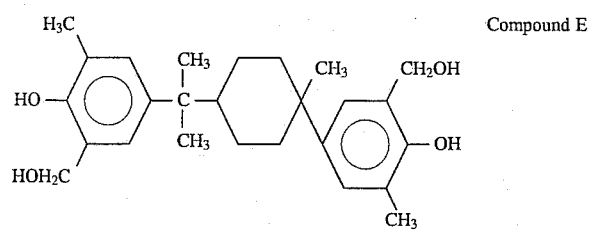

Next, 41.3 g of Compound E obtained above, 99.1 g of phenol and 400 ml of methanol were placed in a three neck flask having a stirrer, a reflux condenser and a thermometer and were heated to 60° C. to dissolve the Compound E. After completion of dissolution 1 g of concentric sulfuric acid was added to the flask. The contents of the flask were heated to reflux and stirred for 5 hours. The reaction mixture solution was poured into 4 liters of distilled water to crystallize. The resulting mixture was filtered to obtain yellow solids, which were then purified by column chromatography to obtain 28.2 g of the desired product, Compound III-1 (white powders).

II. Synthesis of photosensitive materials of the present invention and comparative photosensitive materials are described below (1) Synthesis of Photosensitive Material a (Invention Example):

In a three neck flask were placed 57.0 g of Compound I-3 described above, 53.7 g of 1,2-naphthoquinonediazido-5-sulfonyl chloride, and 750 ml of acetone to prepare a uniform solution. Then, a mixture of 22.3 g of triethylamine and 100 ml of acetone was gradually added dropwise to the solution and the reaction was carried out for 3 hours at 25° C. The reaction mixture formed was poured in 3,000 ml of an aqueous solution of 1% hydrochloric acid and precipitates thus formed were collected by filtration, washed with water, and dried at 40° C. to provide 83.0 g of the 1,2-naphthoquinonediazido-5-sulfonic acid ester of Compound I-3 (Photosensitive Material a).

(2) Synthesis of Photosensitive Material b (Invention Example):

In a three neck flask were placed 45.8 g of Compound I-1 described above, 53.74 g of 1,2-naphthoquinonediazido-5-sulfonyl chloride, and 750 ml of acetone to prepare a uniform solution. Then, a mixture of 22.3 g of triethylamine and 100 ml of acetone was gradually added dropwise to the solution and the reaction was carried out for 3 hours at 25° C. The reaction mixture was poured into 3,000 ml of an aqueous solution of 1% hydrochloric acid and precipitates thus formed were collected by filtration, washed with water, and dried at 40° C. to provide 74.7 g of the 1,2-naphthoquinonediazido-5-sulfonic acid ester of Compound I-1 (Photosensiive Material b).

(3) Synthesis of Photosensitive Material c (Invention Example):

In a three neck flask were placed 42.2 g of Compound II-1 described above, 75.2 g of 1,2-naphthoquinonediazido-5-sulfonyl chloride, and 750 ml of acetone to prepare a uniform solution. Then, a mixture of 29.7 g of triethylamine and 100 ml of acetone was gradually added dropwise to the solution and the reaction was carried out for 3 hours at 25° C. The reaction mixture formed was poured into 3,000 ml of an aqueous solution of 1% hydrochloric acid and precipitates thus formed were collected by filtration, washed with water, and dried at 40° C. to provide 83.9 g of the 1,2- naphthoquinonediazido-5-sulfonic acid ester of Compound II-1 (Photosensitive Material c).

(4) Synthesis of Photosensitive Material d (Invention Example):

In a three neck flask were placed 42.5 g of Compound II-3 described above, 80.6 g of 1,2-naphthoquinonediazido-5-sulfonyl chloride, and 750 ml of acetone to prepare a uniform solution. Then, a mixture of 31.9 g of triethylamine and 100 ml of acetone was gradually added dropwise to the solution and the reaction was carried out for 3 hours at 25° C. The reaction mixture formed was poured into 3,000 ml of an aqueous solution of 1% hydrochloric acid and precipitates thus formed were collected by filtration, washed with water, and dried at 40° C. to provide 98.5 g of the 1,2-naphthoquinonediazido-5-sulfonic acid ester of Compound II-3 (Photosensitive Material d).

(5) Synthesis of Photosensitive Material e (Invention Example):

In a three neck flask were placed 41.0 g of Compound II-2 described above, 53.7 g of 1,2-naphthoquinonediazido-5-sulfonyl chloride, and 750 ml of acetone to prepare a uniform solution. Then, a mixture of 22.3 g of triethylamine and 100 ml of acetone was gradually added dropwise to the solution and the reaction was carried out for 3 hours at 25° C. The reaction mixture formed was poured in 2,800 ml of an aqueous solution of 1% hydrochloric acid and precipitates thus formed were collected by filtration, washed with water, and dried at 40° C. to provide 80.2 g of the 1,2-naphthoquinonediazido-5-sulfonic acid ester of Compound II-2 (Photosensitive Material e).

(6) Synthesis of Photosensitive Material f (Invention Example):

In a three neck flask were placed 56.4 g of Compound III-1 described above, 61.8 g of 1,2-naphthoquinonediazido-5-sulfonyl chloride, and 750 ml of acetone to prepare a uniform solution. Then, a mixture of 24.4 g of triethylamine and 100 ml of acetone was gradually added dropwise to the solution and the reaction was carried out for 3 hours at 25° C. The reaction mixture formed was poured in 3,000 ml of an aqueous solution of 1% hydrochloric acid and precipitates formed were collected by filtration, washed with water, and dried at 40° C. to provide 92.3 g of the 1,2-naphthoquinonediazido-5-sulfonic acid ester of Compound III-1 (Photosensitive Material f).

(7) Synthesis of Photosensitive Material g (Invention Example):

In a three neck flask were placed 44.9 g of Compound III-4 described above, 56.4 g of 1,2-naphthoquinonediazido-5-sulfonyl chloride, and 750 ml of acetone to prepare a uniform solution. Then, a mixture of 22.3 g of triethylamine and 100 ml of acetone was gradually added dropwise to the solution and the reaction was carried out for 3 hours at 25° C. The reaction mixture formed was poured into 3,000 ml of a solution of 1% hydrochloric acid solution and precipitates thus formed were collected by filtration, washed with water, and dried at 40° C. to provide the 80.4 g of the 1,2-naphthoquinonediazido-5-sulfonic acid ester of Compound III-4 (Photosensitive Material g).

(8) Synthesis of Photosensitive Material h (Invention Example):

In a three neck flask were placed 22.9 g of Compound III-2 described above, 53.7 g of 1,2-naphthoquinonediazido-5-sulfonyl chloride, and 600 ml of acetone to prepare a uniform solution. Then, a mixture of 21.2 g of triethylamine and 80 ml of acetone was gradually added dropwise to the solution and the reaction was carried out for 6 hours at 25° C. The reaction mixture formed was poured into 2,500 ml of an aqueous solution of 1% hydrochloric acid and precipitates thus formed were collected by filtration, washed with water, and dried at 40° C. to provide 60.4 g of the 1,2-naphthoquinonediazido-5-sulfonic acid ester of Compound III-2 (Photosensitive Material h).

(9) Synthesis of Photosensitive Material m (Comparative Example):

In a three neck flask were placed 12.3 g of 2,3,4,4'-tetrahydroxybenzophenone, 40.3 g of 1,2-naphthoquinonediazido-5-sulfonyl chloride, and 300 ml of acetone to prepare a uniform solution. Then, a mixture of 15.2 g of triethylamine and 50 ml of acetone was gradually added dropwise to the solution and the reaction was carried out for 3 hours at 25° C. The reaction mixture formed was poured in 1,500 ml of an aqueous solution of 1% hydrochloric acid and precipitates formed were collected by filtration, washed with water, and dried at 40° C. to provide 39.7 g of the 1,2-naphthoquinonediazido-5-sulfonic acid ester of 2,3,4,4'-tetrahydroxybenzophenone (Photosensitive Material m).

(10) Synthesis of Photosensitive Material n (Comparative Example):

In a three neck flask were placed 42.5 g of α,α,α'-tris(4-hydroxyphenyl)-1-ethyl-4-isopropylbenzene, 61.8 g of 1,2-naphthoquinonediazido-5-sulfonyl chloride, and 650 ml of acetone to prepare a uniform solution. Then, a mixture of 24.4 g of triethylamine and 80 ml of acetone was gradually added dropwise to the solution and the reaction was carried out for 4 hours at 25° C. The reaction mixture formed was poured into 2,500 ml of an aqueous solution of 1% hydrochloric acid and precipitates formed were colleced by filtration, washed with water, and dried a 40° C. to provie 83.1 g of the 1,2-naphthoquinonediazido-5-sulfonic acid ester of α,α,α'-tris(4-hydroxyphenyl)-1-ethyl-4-isopropylbenzene (Photosensitive Material n).

(11) Synthesis of Photosensitive Material o (Comparative Example):

In a three neck flask were placed 30.8 g of 2,2-bis[4-hydroxy-3,5-di(4-hydroxybenzyl)phenyl]propane, 53.8 g of 1,2-naphthoquinonediazido-5-sulfonyl chloride, and 600 ml of acetone to prepare a uniform solution. Then, a mixture of 21.3 g of triethylamine and 50 ml of acetone was gradually added dropwise to the solution and the reaction was carried out for 6 hours at 25° C. The reaction mixture formed was poured into 2,500 ml of an aqueous solution of 1% hydrochloric acid and precipitates thus formed were collected by filtration, washed with water, and dried at 40° C. to provide 67.2 g of the 1,2-naphthoquinonediazido-5-sulfonic acid ester of 2,2-bis[4-hydroxy-3,5-di(4-hydroxybenzyl)phenyl]propane (Photosensitive Material o).

(12) Synthesis of Photosensitive Material p (Comparative Example):

In accordance with the method described in Example 11 of JP-A-2-285351 (U.S. Pat. No. 5,173,389), a 1,2-naphthoquinonediazido-5-sulfonic acid ester of Compound (k') was prepared as described below.

In a three neck flask were placed 10 g of the following compound (k'), (k')

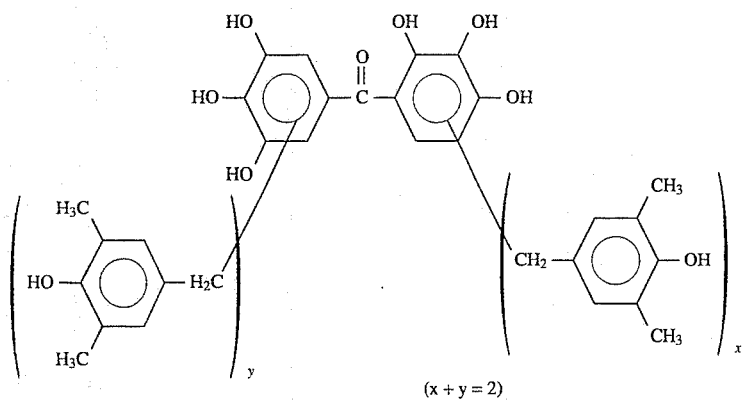

(x + y = 2)

29.5 g of 1,2-naphthoquinonediazido-5-sulfonyl chloride and 330 ml of acetone to prepare a uniform solution. Thereafter, a mixture of 11.7 g of triethylamine and 50 ml of acetone was gradually added dropwise thereto, and the reaction was conducted at 25° C. for 3 hours. The reaction mixture was then poured into 2000 ml of a 1% hydrochloric acid aqueous solution. The precipitate formed was collected by filtration, washed with water, and dried (at 40° C.) to obtain 33.6 g of 1,2-naphthoquinonediazido-5-sulfonic acid ester of the compound (k').

(13) Synthesis of Photosensitive Material q (Comparative Example):

In accordance with the method described in Exmaple 13 of JP-A-2-28531 (U.S. Pat. No. 5,173,389), a 1,2-naphthoquinonediazido-5-sulfonic acid ester of Compound (m') was prepared as described below.

In a three neck flask were placed 10 g of the following Compound (m'), (m')

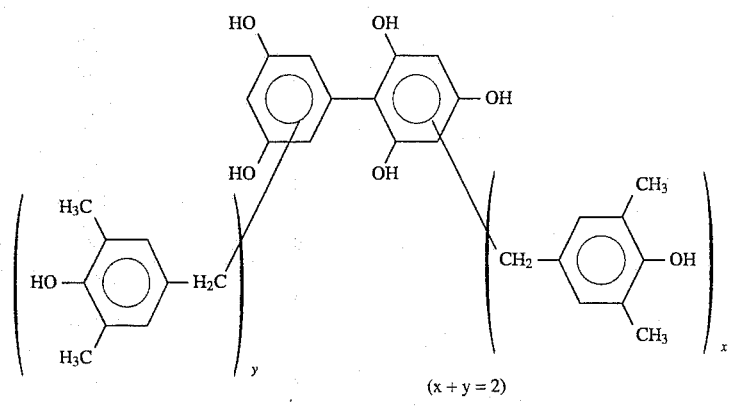

(x + y = 2)

27.2 g of 1,2-naphthoquinonediazido-5-sulfonyl chloride and 300 ml of acetone to prepare a uniform solution. Thereafter, a mixture of 10.8 g of triethylamine and 45 ml of acetone was gradually added dropwise thereto, and the reaction was conducted at 25° C. for 3 hours. The reaction mixture was then poured into 1800 ml of a 1% hydrochloric acid aqueous solution. The precipitate formed was collected by filtration, washed with water, and dried (at 40° C.) to obtain 32.0 g of 1,2-naphthoquinonediazido-5-sulfonic acid ester of the compound (m').

(14) Synthesis of Photosensitive Material r (Comparative Example):

In a three neck flask were placed 39.1 g of the following compound described in Example 5 of JP-A-2-296248,

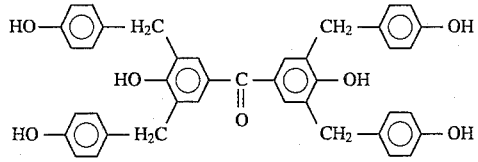

80.6 g of 1,2-naphthoquinonediazido-5-sulfonyl chloride and 1000 ml of acetone to prepare a uniform solution. Thereafter, a mixture of 33.4 g of triethylamine and 100 ml of acetone was gradually added dropwise to the solution, and the reaction was conducted at 25° C. for 6 hours. The reaction mixture was then poured into 4000 ml of a 1% hydrochloric acid aqueous solution. The precipitates formed were collected by filtration, washed with water, and dried at 40° C. to obtain 89.8 g of 1,2-naphthoquinonediazido-5-sulfonic acid ester of the above compound.

III. Synthesis of two novolac resins used in the examples and comparative examples described herein after are described below (1) Synthesis of Novolac Resin A:

In a three neck flask were placed 40 g of m-cresol, 60 g of p-cresol, 49 g of an aqueous 37% formalin solution, and 0.13 g of oxalic acid and the temperature of the mixture was raised to 100° C. with stirring to carry out the reaction for 15 hours.

Thereafter, the temperature was raised to 200° C. and the pressuer was gradually reduced to 5 mmHg to remove the water, the unreacted monomers, formaldehyde, oxalic acid, etc. Then, the molten alkali-soluble novolac resin formed was cooled to room temperature and recovered. The weight average molecular weight of Novolac Resin A obtained was 7100 (converted as polystyrene).

(2) Synthesis of Novolac Resin B:

In a three neck flask were placed 50 g of m-cresol, 25 g of p-cresol, 28 g of 2,5-xylenol, 53 g of an aqueous 37% formalin solution, and 0.15 g of oxalic acid and after increasing the temperature of the mixture to 100° C. with stirring, the reaction was carried out for 12 hours.

Thereafter, the temperature was raised to 100° C. and the pressure was gradually reduced to 1 mmHg to remove the water, the unreacted monomers, formaldehyde, oxalic acid, etc. Then, a molten novolac resin formed was cooled to room temperature and recovered. The weight average molecular weight of the novolac resin obtained was 4300 (converted as polystyrene).

Then, after completely dissolving 20 g of the novolac resin in 60 g of methanol, 30 g of water was gradually added to the solution with stirring to precipitate the resin component. The upper layer was removed by decantation, the resin component precipitated was recovered, heated to 40° C., and dried for 24 hours under reduced pressure to provide alkali-soluble novolac resin B.

The weight average molecular weight of the novolac resin obtained was 8920 (converted as polystyrene) and the contents of monomers, dimers, and trimers were 0%, 2.3%, and 3.5%, respectively.

IV. Preparation and Evaluation of Positive Working Photoresist Compositions

Each of Photosensitive Materials a to r obtained in II. Syntheses (1) to (14) described above was mixed with each Novolac Resin obtained in III. Syntheses (1) and (2) described above, the solvent, and, if necessary, a polyhydroxy compound shown in Table 1 at the ratio shown in Table 1, and after forming each uniform solution, each solution was filtered using a micro filter having a pore size of 0.2 μm to provide each photoresist composition.

The photoresist composition was coated on silicon wafers using a spinner and dried for 60 seconds at 90° C. by a vacuum adsorption type hot plate to form resist films or layers having a thickness of 0.97 μm and 1.02 μm, respectively.

After exposing the layers to light using a reduced projection exposure apparatus (Reduced Projection Exposure Apparatus, NSR-2005i9C, trade name, manufactured by Nikon Corporation), PEB was carried out for 60 seconds at 110° C., the layers were developed with an aqueous solution of 2.38% tetramethylammonium hydroxide for one minute, washed with water for 30 seconds, and dried.

The resist pattern on a silicon wafer thus formed was observed by a scanning type electron microscope and the resist was evaluated. The results are shown in Table 2 below.

The sensitivity was defined by the reciprocal of the light exposure required for reproducing the mask pattern of 0.60 μm and was shown by the relative value to the sensitivity of a resist film having a thickness of 1.02 μm in Comparative Example 1.

The residual film ratio was shown by the percent of the ratio of the unexposed portion before and after development.

The resolving power was shown by the limiting resolving power in the exposure amount reproducing the mask pattern of 0.60 μm.

The heat resistance was shown by the temperature that did not cause change in a resist pattern formed on a silicon wafer when the silicon wafer was baked on a hot plate at the temperature for 4 minutes.

The form of the resist was shown by the angle (θ) formed between the wall face of the resist at the section of a resist pattern of 0.50 μm and the surface of the silicon wafer.

The storage stability was evaluated as follows. That is, a solution of each positive working photoresist composition was allowed to stand at room temperature for 3 months and the presence of deposits in the solution was then determined. When deposits were not observed, the sample was evaluated as o and when deposits were observed, the sample was evaluated as x.

TABLE 1

| | Formulation of Positive Working Photoresist Composition: | | | | | | | |
|---|---|---|---|---|---|---|---|---|
| | Novolac Resin | | Photosensitive Material | | Polyhydroxy Compound(*) | | Solvent(**) | |
| | kind | addition amount | kind | addition amount | kind | addition amount | kind | addition amount |
| Example 1 | A | 100 | a | 25 | — | — | S-1 | 350 |
| Example 2 | A | 100 | b | 25 | — | — | S-2 | 380 |
| Example 3 | B | 85 | a | 24 | P-1 | 15 | S-1 | 350 |
| Example 4 | B | 80 | b | 25 | P-2 | 20 | S-1 | 350 |
| Example 5 | A | 100 | c | 26 | — | — | S-1 | 350 |
| Example 6 | A | 100 | d | 24 | — | — | S-2 | 380 |
| Example 7 | A | 100 | e | 25 | — | — | S-3 | 360 |
| Example 8 | B | 86 | c | 23 | P-1 | 14 | S-1 | 350 |
| Example 9 | B | 78 | d | 24 | P-3 | 22 | S-1 | 350 |
| Example 10 | B | 83 | e | 25 | P-2 | 17 | S-2 | 380 |
| Example 11 | A | 100 | f | 24 | — | — | S-1 | 350 |
| Example 12 | A | 100 | g | 25 | — | — | S-2 | 380 |
| Example 13 | A | 100 | h | 25 | — | — | S-3 | 360 |
| Example 14 | B | 87 | f | 25 | P-1 | 13 | S-1 | 350 |
| Example 15 | B | 82 | g | 26 | P-3 | 18 | S-1 | 350 |
| Example 16 | B | 83 | h | 25 | P-2 | 17 | S-2 | 380 |
| Comparative Example 1 | A | 100 | m | 25 | — | — | S-1 | 350 |
| Comparative Example 2 | A | 100 | n | 25 | — | — | S-1 | 350 |
| Comparative | A | 100 | o | 24 | — | — | S-1 | 350 |

TABLE 1-continued

Formulation of Positive Working Photoresist Composition:

| | Novolac Resin | | Photosensitive Material | | Polyhydroxy Compound(*) | | Solvent(**) | |
|---|---|---|---|---|---|---|---|---|
| | kind | addition amount | kind | addition amount | kind | addition amount | kind | addition amount |
| Example 3 Comparative Example 4 | B | 85 | m | 25 | P-1 | 15 | S-2 | 380 |
| Comparative Example 5 | B | 86 | m | 25 | P-2 | 14 | S-2 | 380 |
| Comparative Example 6 | B | 87 | m | 25 | P-2 | 13 | S-2 | 380 |
| Comparative Example 7 | A | 100 | p | 25 | — | — | S-1 | 350 |
| Comparative Example 8 | A | 100 | q | 25 | — | — | S-1 | 350 |
| Comparative Example 9 | A | 100 | r | 24 | — | — | S-1 | 350 |

(*)P-1: α,α,α'-Tris(4-hydroxyphenyl)-1-ethyl-4-isopropylbenzene.
P-2: Tris(4-hydroxyphenyl)methane.
P-3: 1,1-Bis(4-hydroxyphenyl)cyclohexane.
(**)S-1: Ethylcellosolve acetate.
S-2: Ethyl 2-hydroxypropionate.
S-3: Methyl 3-methoxypropionate.

TABLE 2

Evaluation Result of Resist Performance

| Resist Film | Relative senstivity | | Resolving power (μm) | | Heat resistance (°C.) | Resist form (θ) | | Deposit | Storage stability |
|---|---|---|---|---|---|---|---|---|---|
| Thickness (μm) | 0.97 | 1.02 | 0.97 | 1.02 | 0.97 | 0.97 | 1.02 | | |
| Example 1 | 1.1 | 1.2 | 0.32 | 0.32 | 150 | 89 | 89 | ○ | o |
| Example 2 | 1.2 | 1.3 | 0.32 | 0.32 | 150 | 88 | 89 | o | o |
| Example 3 | 1.2 | 1.4 | 0.30 | 0.30 | 160 | 88 | 88 | o | o |
| Example 4 | 1.2 | 1.3 | 0.30 | 0.30 | 160 | 88 | 88 | o | o |
| Example 5 | 1.1 | 1.2 | 0.32 | 0.32 | 150 | 89 | 89 | — | o |
| Example 6 | 1.3 | 1.4 | 0.32 | 0.32 | 150 | 88 | 89 | — | o |
| Example 7 | 1.3 | 1.4 | 0.32 | 0.32 | 160 | 89 | 89 | — | o |
| Example 8 | 1.2 | 1.4 | 0.30 | 0.30 | 160 | 89 | 89 | — | o |
| Example 9 | 1.2 | 1.3 | 0.30 | 0.30 | 160 | 88 | 88 | — | o |
| Example 10 | 1.2 | 1.3 | 0.32 | 0.32 | 160 | 89 | 89 | — | o |
| Example 11 | 1.2 | 1.3 | 0.30 | 0.30 | 150 | 89 | 89 | — | o |
| Example 12 | 1.1 | 1.2 | 0.30 | 0.30 | 160 | 89 | 89 | — | o |
| Example 13 | 1.3 | 1.4 | 0.32 | 0.32 | 160 | 88 | 88 | — | |
| Example 14 | 1.2 | 1.4 | 0.30 | 0.30 | 160 | 89 | 89 | — | o |
| Example 15 | 1.1 | 1.2 | 0.30 | 0.30 | 160 | 89 | 89 | — | o |
| Example 16 | 1.2 | 1.3 | 0.30 | 0.30 | 160 | 89 | 88 | — | o |
| Comparative Example 1 | 0.9 | 1.0 | 0.40 | 0.45 | 140 | 84 | 83 | — | x |
| Comparative Example 2 | 0.8 | 0.7 | 0.45 | 0.40 | 140 | 86 | 87 | — | o |
| Comparative Example 3 | 1.0 | 1.2 | 0.35 | 0.45 | 150 | 87 | 86 | — | o |
| Comparative Example 4 | 0.9 | 1.1 | 0.36 | 0.42 | 150 | 86 | 88 | — | o |
| Comparative Example 5 | 0.9 | 1.0 | 0.38 | 0.40 | 150 | 88 | 88 | — | o |
| Comparative Example 6 | 0.9 | 1.0 | 0.35 | 0.40 | 150 | 88 | 88 | — | x |
| Comparative Example 7 | 1.1 | 1.3 | 0.38 | 0.32 | 150 | 85 | 84 | — | x |
| Comparative Example 8 | 1.2 | 1.3 | 0.38 | 0.32 | 150 | 87 | 84 | — | o |
| Comparative Example 9 | 0.8 | 0.9 | 0.36 | 0.32 | 150 | 89 | 89 | — | x |

From the results shown in the above Tables 1 and 2, it can be seen that the positive working photoresist compositions of the present invention are excellent in sensitivity, developing property, heat resistance, storage stability, and have particularly high resolving power and its low dependence on film thickness and can thus be suitably used as photoresists for fine work.

While the invention has been described in detail and with reference to specific embodiments thereof. It will be apparent to one skilled in the art that various changes and modifications can be made therein without departing from the spirit and scope thereof.

What is claimed is:

1. A positive working photoresist composition comprising, in admixture, at least one alkali-soluble resin and one or both of a 1,2-naphthoquinonediazido-5 sulfonic acid ester and a 1,2-naphthoquinonediazido-4-sulfonic acid ester of a polyhydroxy compound selected from the group consisting of compounds represented by the following formulae (I), (II), and (III):

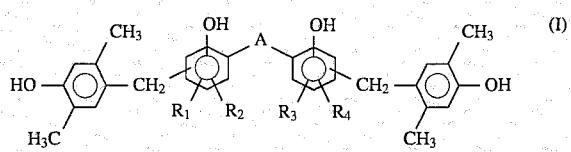

wherein $R_1$ to $R_4$, which may be the same or different, each represents a hydrogen atom, an alkyl group having 1–8 carbon atoms; and A represents —S— or —SO$_2$;

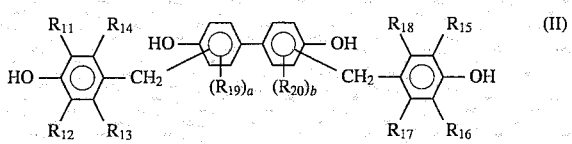

wherein $R_{11}$ to $R_{20}$, which may be the same or different, each represents a hydrogen atom, a halogen atom, an alkyl group, an aryl group, an alkoxy group, an acyl group, an alkenyl group, an aralkyl group, an alkoxycarbonyl group, an arylcarbonyl group, an acyloxy group, a nitro group, or a cyano group, provided that when one or both of $R_{11}$ and $R_{12}$ are groups other than a hydrogen atom, at least one of $R_{13}$ and $R_{14}$ is a group other than a hydrogen atom, and when one or both of $R_{15}$ and $R_{16}$ are groups other than a hydrogen atom, at least one of $R_{17}$ and $R_{18}$ is a group other than hydrogen atom; and a and b each represents 1 or 2; and

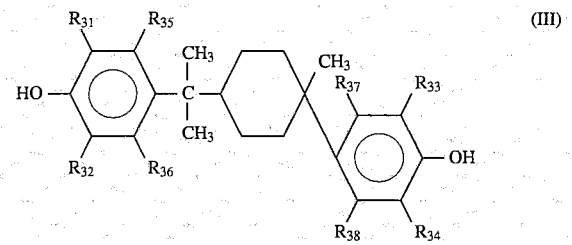

wherein $R_{31}$ to $R_{34}$, which may be the same or different, each represents a hydrogen atom, a hydroxy group, a halogen atom, an alkyl group, an aryl group, an alkoxy group, an acyl group, an alkenyl group, an aralkyl group, an alkoxycarbonyl group, an arylcarbonyl group, an acyloxy group, a nitro group, or a group represented by the following formula:

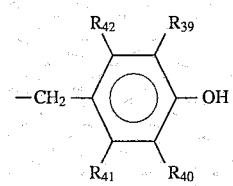

wherein $R_{39}$ to $R_{42}$, which may be the same or different, each represents a hydrogen atom, an alkyl group, or an alkoxy group; and $R_{35}$ to $R_{38}$, which may be the same or different, each represents a hydrogen atom, a hydroxy group, a halogen atom, an alkyl group, an aryl group, an alkoxy group, an acyl group, an alkenyl group, an aralkyl group, an alkoxycarbonyl group, an arylcarbonyl group, a nitro group, or a cyano group.

2. The composition of claim 1, wherein a resist pattern composed of a line width of 1 μm or less is formed.

3. The composition of claim 1, wherein said alkali-soluble resin is selected from the group consisting of a novolac resin, an acetone-pyrogallol resin, and polyhydroxystyrene.

4. The composition of claim 1, wherein said alkali-soluble resin is a novolac resin having a weight average molecular weight of about 2,000 to 30,000.

5. The composition of claim 1, wherein said alkali-soluble resin is a novolac resin having a weight average molecular weight of about 6,000 to 20,000.

6. The composition of claim 1, wherein the ratio of said 1,2-napthoquinonediazido-5-sulfonic acid ester of a polyhydroxy compound or said 1,2-napthoquinonediazido-4-sulfonic acid ester of a polyhydroxy compound to said alkali-soluble resin is from about 5 to about 100 parts by weight to 100 parts by weight of said alkali-soluble resin.

7. The composition of claim 6, wherein the ratio of said 1,2-napthoquinonediazido-5-sulfonic acid ester of a polyhydroxy compound or said 1,2-napthoquinonediazido-4-sulfonic acid ester of a polyhydroxy compound to said alkali-soluble resin is from about 10 to about 50 parts by weight to 100 parts by weight of said alkali-soluble resin.

8. The composition of claim 1, wherein said polyhydroxy compound is represented by formula (I) said alkyl group of said $R_1$ to $R_4$ of said formula (I) is selected from the group consisting of methyl, ethyl and propyl.

9. The composition of claim 1, wherein said polyhydroxy compound is represented by formula (II) and said halogen atom of said $R_{11}$ to $R_{20}$ of said formula (II) is selected from the group consisting of chlorine, bromine, and iodine; said alkyl group of said $R_{11}$ to $R_{20}$ of said formula (II) is selected from the group consisting of methyl, ethyl, propyl, n-butyl, iso-butyl, sec-butyl, and t-butyl; said alkoxy group of said $R_{11}$ to $R_{20}$ of said formula (II) is selected from the group consisting of methoxy, ethoxy, hydroxyethoxy, propoxy, hydroxypropoxy, isopropoxy, n-butoxy, iso-butoxy, sec-butoxy, and t-butoxy; said alkenyl group of said $R_{11}$ to $R_{20}$ of said formula (II) is selected from the group consisting of vinyl, propenyl, allyl, and butenyl; said aryl group of said $R_{11}$ to $R_{20}$ of said formula (II) is selected from the group consisting of phenyl, xylyl, tolyl, and cumenyl; said aralkyl group of said $R_{11}$ to $R_{20}$ of said formula (II) is selected from the group consisting of benzyl, phenetyl, and cumyl; said alkoxycarbonyl group of said $R_{11}$ to $R_{20}$ of said formula (II) is benzoyloxy; said acyloxy group of said $R_{11}$ to $R_{20}$ of said formula (II) is selected from the group consisting of butyryloxy and acetoxy; and said acyl group of said $R_{11}$ to $R_{20}$ of said formula (II) is selected from the group consisting of formyl, acetyl, butyryl, benzoyl, cyanamoyl, and valeryl.

10. The composition of claim 1, wherein said polyhydroxy compound is represented by formula (III) and said halogen atom of said $R_{31}$ to $R_{42}$ of said formula (III) is selected from the group consisting of chlorine, bromine, and iodine; said alkyl group of said $R_{31}$ to $R_{42}$ of said formula (III) is selected from the group consisting of methyl, ethyl, propyl, n-butyl, iso-butyl, sio-butyl, sec-butyl, and t-butyl; and said alkoxy group of said $R_{31}$ to $R_{42}$ of said formula (III) is selected from the group consisting of methoxy, ethoxy, hydroxyethoxy, propoxy, hydropropoxy, isopropoxy, n-butoxy, iso-butoxy, sec-butoxy, and t-butoxy; said alkenyl group of said $R_{31}$ to $R_{42}$ of said formula (III) is selected from the group consisting of vinyl, propenyl, allyl, and butenyl; said aryl group of said $R_{31}$ to $R_{42}$ of said formula (III) is selected from the group consisting of phenyl, xylyl, tolyl, and cumenyl; said aralkyl group of said $R_{31}$ to $R_{42}$ of said formula (III) is selected from the group consisting of benzyl, phenetyl, and cumyl; said alkoxycarbonyl group of said $R_{31}$ to $R_{42}$ of said formula (III) is selected from the group consisting of methoxycarbonyl and ethoxycarbonyl; said acyloxy group of said $R_{31}$ to $R_{42}$ of said formula (III) is selected from the group consisting of butyryloxy and acetoxy; said acyl group of said $R_{31}$ to $R_{42}$ of said formula (III) is selected from the group consisting of formyl, acetyl, butyryl, benzoyl, cyanamoyl, and valeryl, and said arylcarboxy group of said $R_{31}$ to $R_{42}$ of said formula (III) is benzoyloxy.

\* \* \* \* \*